(12) United States Patent
Mora et al.

(10) Patent No.: US 12,714,212 B2
(45) Date of Patent: Aug. 25, 2026

(54) SLEEK CASE FOR A MOBILE DEVICE

(71) Applicant: 1Lss, Inc., Los Angeles, CA (US)

(72) Inventors: Fernando Mora, Reseda, CA (US); Alejandro Baca, Sherman Oaks, CA (US); Mydul R. Islam, Los Angeles, CA (US); Kevin H. Vuong, Baldwin Park, CA (US)

(73) Assignee: 1LSS, INC., Los Angeles, CA (US)

( * ) Notice: Subject to any disclaimer, the term of this patent is extended or adjusted under 35 U.S.C. 154(b) by 120 days.

(21) Appl. No.: 18/899,173

(22) Filed: Sep. 27, 2024

(65) Prior Publication Data

US 2025/0366580 A1 Dec. 4, 2025

Related U.S. Application Data

(63) Continuation of application No. 18/678,341, filed on May 30, 2024, now Pat. No. 12,127,650.

(51) Int. Cl.

*G06F 1/16* (2006.01)
*A45C 11/00* (2006.01)
*A45F 5/10* (2006.01)
*G06F 1/18* (2006.01)
*H04M 1/04* (2006.01)
*A45F 5/00* (2006.01)
*H05K 5/00* (2006.01)

(52) U.S. Cl.

CPC ................ *A45C 11/00* (2013.01); *A45F 5/10* (2013.01); *G06F 1/16* (2013.01); *G06F 1/181* (2013.01); *H04M 1/04* (2013.01); *A45C 11/002* (2025.01); *A45C 2200/15* (2013.01); *A45F 5/1516* (2025.01); *H04M 2250/52* (2013.01); *H05K 5/00* (2013.01)

(58) Field of Classification Search

CPC .......... G06F 1/16; G06F 1/163; G06F 1/1629; A45F 5/1516

See application file for complete search history.

(56) References Cited

U.S. PATENT DOCUMENTS 8,223,489 B2 7/2012 Shih
8,264,310 B2 9/2012 Lauder
8,374,657 B2 * 2/2013 Interdonato ............... A45F 5/00 455/344
8,380,264 B2 2/2013 Hung
D679,271 S * 4/2013 Liu ............................. D13/103
9,185,954 B2 11/2015 Cheung
9,401,239 B2 7/2016 Bell
9,866,663 B2 1/2018 Kim
10,001,243 B2 * 6/2018 Cavalcante .......... F16M 13/022
10,237,384 B2 3/2019 Holder
10,348,352 B2 7/2019 Barnett (Continued)

OTHER PUBLICATIONS

Loobival—https://www.amazon.com/Invisible-Kickstand-Compatible-Magnetic-Transparent/dp/B0BZRQ5FPB?th=1, at least as early as May 29, 2024.

(Continued)

*Primary Examiner* — Anthony Q Edwards
(74) *Attorney, Agent, or Firm* — Cislo & Thomas LLP

(57) ABSTRACT

A protective case for a mobile device. A housing defines a recess to receive the mobile device. A kickstand and/or a finger loop are provided and configured to avoid increasing the maximum thickness of the case necessitated by the lens structure of the mobile device.

18 Claims, 11 Drawing Sheets

(56) References Cited

U.S. PATENT DOCUMENTS

| | | | | |
|---|---|---|---|---|
| 10,652,379 | B2 * | 5/2020 | Holder | H04M 1/04 |
| 10,686,481 | B2 | 6/2020 | Barnett | |
| 10,742,251 | B2 | 8/2020 | Barnett | |
| 10,965,336 | B2 * | 3/2021 | Hirsch | A45F 5/021 |
| 10,973,310 | B2 | 4/2021 | Vlassis | |
| 11,149,902 | B2 | 10/2021 | Barnett | |
| 11,190,227 | B2 | 11/2021 | Barnett | |
| 11,211,963 | B1 * | 12/2021 | Cunningham | A45F 5/00 |
| 11,330,093 | B2 * | 5/2022 | Backus | H04M 1/04 |
| 11,452,365 | B2 * | 9/2022 | Vasquez | A45F 5/10 |
| 11,572,977 | B2 | 2/2023 | Murphy | |
| 2013/0277237 | A1 | 10/2013 | Wang | |
| 2014/0332418 | A1 | 11/2014 | Cheung | |
| 2017/0150792 | A1 | 6/2017 | Kim | |
| 2018/0237214 | A1 | 8/2018 | Rayner | |
| 2020/0259517 | A1 * | 8/2020 | Hirsch | A45F 5/00 |
| 2020/0288833 | A1 | 9/2020 | Fathollahi | |
| 2020/0323332 | A1 * | 10/2020 | Pierson | A45F 5/10 |
| 2021/0059370 | A1 * | 3/2021 | Del Toro | F16M 11/041 |
| 2021/0314430 | A1 * | 10/2021 | Backus | H04M 1/04 |
| 2022/0231721 | A1 * | 7/2022 | King | A45C 13/1069 |
| 2023/0014496 | A1 | 1/2023 | Feng | |
| 2023/0297138 | A1 | 9/2023 | Ahari Hashemi | |
| 2024/0209978 | A1 * | 6/2024 | Ramirez | F16M 11/10 |

OTHER PUBLICATIONS

L K STORE—https://www.amazon.com/Adjustable-Kickstand-Compatible-Protection-Anti-Slip/dp/B0D14LKGB8/ref=asc_df_B0D14LKGB8/?tag=hyprod-20&linkCode=df0&hvadid=698594539187&hvpos=&hvnetw=g&hvrand=5538223762219510854&hvpone=&hvptwo=&hvqmt=&hvdev=c&hvdvcmdl=&hvlocint=&hvlocphy=9061089&hvtargid=pla-2308904915494&mcid=2b796fb61dd83f09974f026f931a900d&gad_source=1&th=1; at least as early as May 29, 2024.

ESR—https://www.amazon.com/ESR-iPhone-Plus-Military-Grade-Scratch-Resistant/dp/B0B6Q6J7BS?th=1; at least as early as May 29, 2024.

* cited by examiner d
104
100
206
230
102
300
210
516
510
514
512
604
602
116

SLEEK CASE FOR A MOBILE DEVICE

CROSS REFERENCE TO RELATED APPLICATIONS

This application is a continuation of U.S. application Ser. No. 18/678,341 filed May 30, 2024 entitled CASE FOR A MOBILE DEVICE FLOATING MAGNETIC ATTACHMENT FEATURE.

BACKGROUND

Technological Field

Embodiments of the invention relate to a case for a mobile device. More specifically, embodiments of the invention relate to a case for a mobile device with magnetic attachment feature.

Background

Mobile devices, particularly mobile phones are ubiquitous in modern society. With increasing complexity of modern smart phones, the cost continues to rise. Many users want to protect their devices from inadvertent drops or other impacts. To that end protective phone cases have proliferated. Users also find it useful to be able to attach their devices in a vertical or substantially vertical orientation to e.g. dashboards, exercise equipment etc. so the device can be viewed while e.g. driving, exercising or the like. To that end various mechanisms for attaching the phone case to vertical surfaces magnetically appeared on the market. Largely, these rely on the ability of the case to abut the magnetic surface to which connection is desired. When the back surface of devices were substantially planar, that was reasonably easier to accomplish. But camera lens requirements in newer models have rendered previously existing magnetic attachments ineffective.

BRIEF DESCRIPTION OF THE DRAWINGS

Embodiments of the invention are illustrated by way of example and not by way of limitation in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
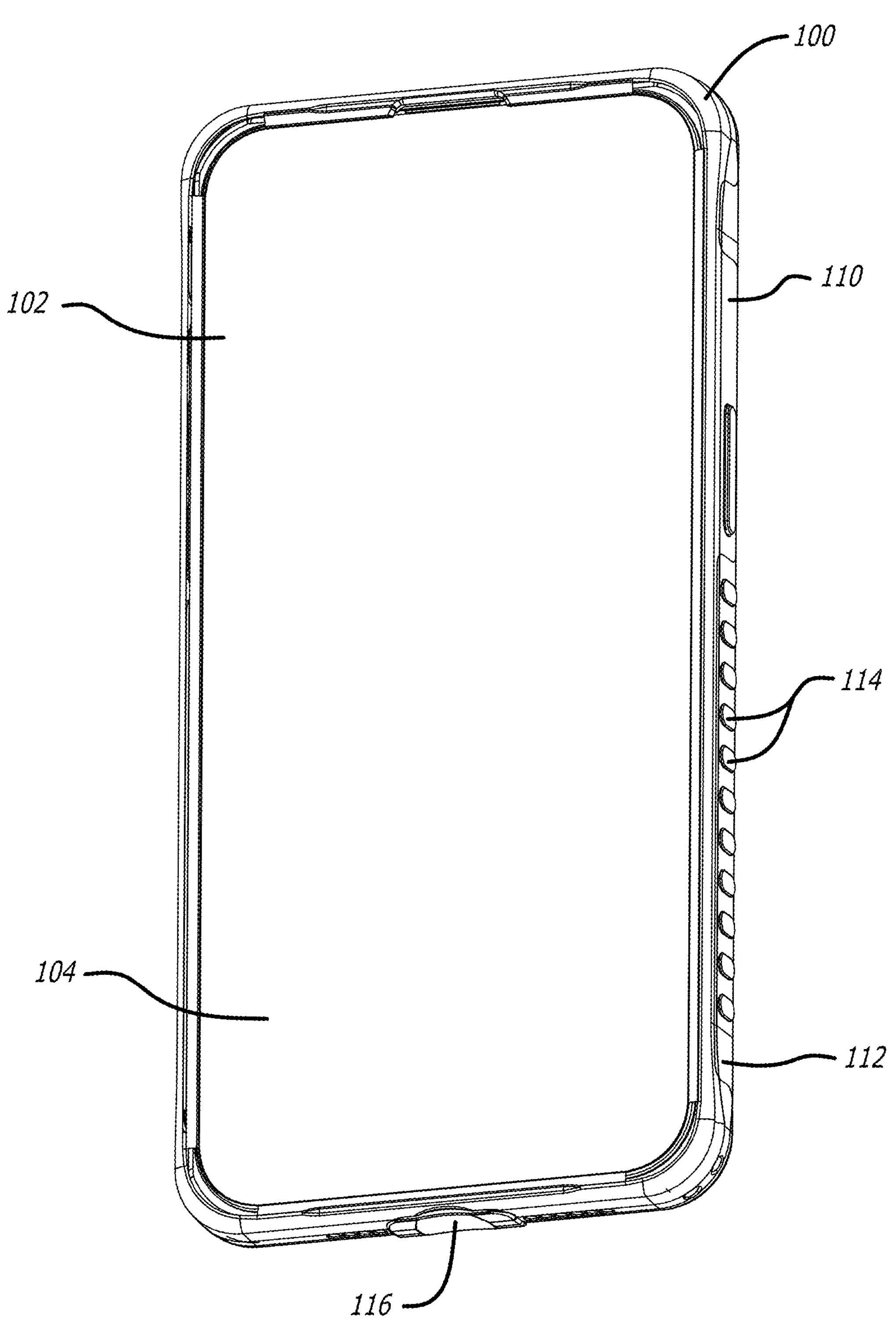
FIG. 1 is a perspective view of a case according to one embodiment of the invention holding a mobile device.

Embodiments of the invention provide a protective case for a mobile device. Some embodiments provide a collection of useful features each of which could be used without the other features and would still provide superior protection and functionality from mobile device cases available today.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

FIG. 1 is a perspective view of a case according to one embodiment of the invention holding a mobile device. A mobile device 102 resides within a recess defined by a housing 100. In some embodiments, a transparent screen protector 104 may be provided with case to protect the screen of the mobile device 102 from scratches or other damage during use. In one embodiment, screen protector 104 may be made of a transparent adhesive film that adheres to the screen of mobile device 102. In other embodiments, the screen protector 104 may be made of glass or a transparent acrylic material.

In some embodiments, housing 100 may be formed from two distinct synthetic materials, a relatively flexible material 110, such as thermoplastic polyurethane (TPU) and a relatively rigid material 112 such as polycarbonate. In some embodiments, the housing 100 is formed by dual injection molding the flexible material 110 and the rigid material 112. The TPU permits the front of the case to be flexible enough to allow the device to be easily inserted into the housing. The polycarbonate provides excellent rigidity and protective strength for the phone once within the case. Historical housings made entirely of TPU tend to deform overtime, so they no longer tightly conform to the side wall of the device. By making the back of the housing and a part of the side wall from the rigid material the housing has greater long term durability.

Unfortunately, polycarbonate is very slick and TPU is also undesirably slick unless specially coated with an oil-based paint. When so coated, TPU tends to rapidly collect dirt and oil and quickly becomes aesthetically undesirable. In some embodiments, elastomeric grips 114 are coupled to the housing 100 to facilitate handling by a user. Suitable grips 114 may be made from silicone, natural rubber, or other resilient material with good cushion and frictional characteristics.

When holding a phone, and particularly when holding a phone using a finger loop, the user's little finger typically rests on the bottom edge of the phone, more or less aligned with the phone's power port. Most existing phone cases have the power port exposed which leaves the case with a sharp edge that is uncomfortable for the user's finger and permits dirt and lint to collect in the power port. Some embodiments of the invention include an elastomeric digit cushion 116. Digit cushion 116 may be made of silicone, natural rubber, or the like. In addition to providing user comfort, digit cushion 116 protects the power port from dirt and debris and provides increased friction when the device uses a kickstand in portrait mode. Both of these functions are described in greater detail below.

Figure 2:
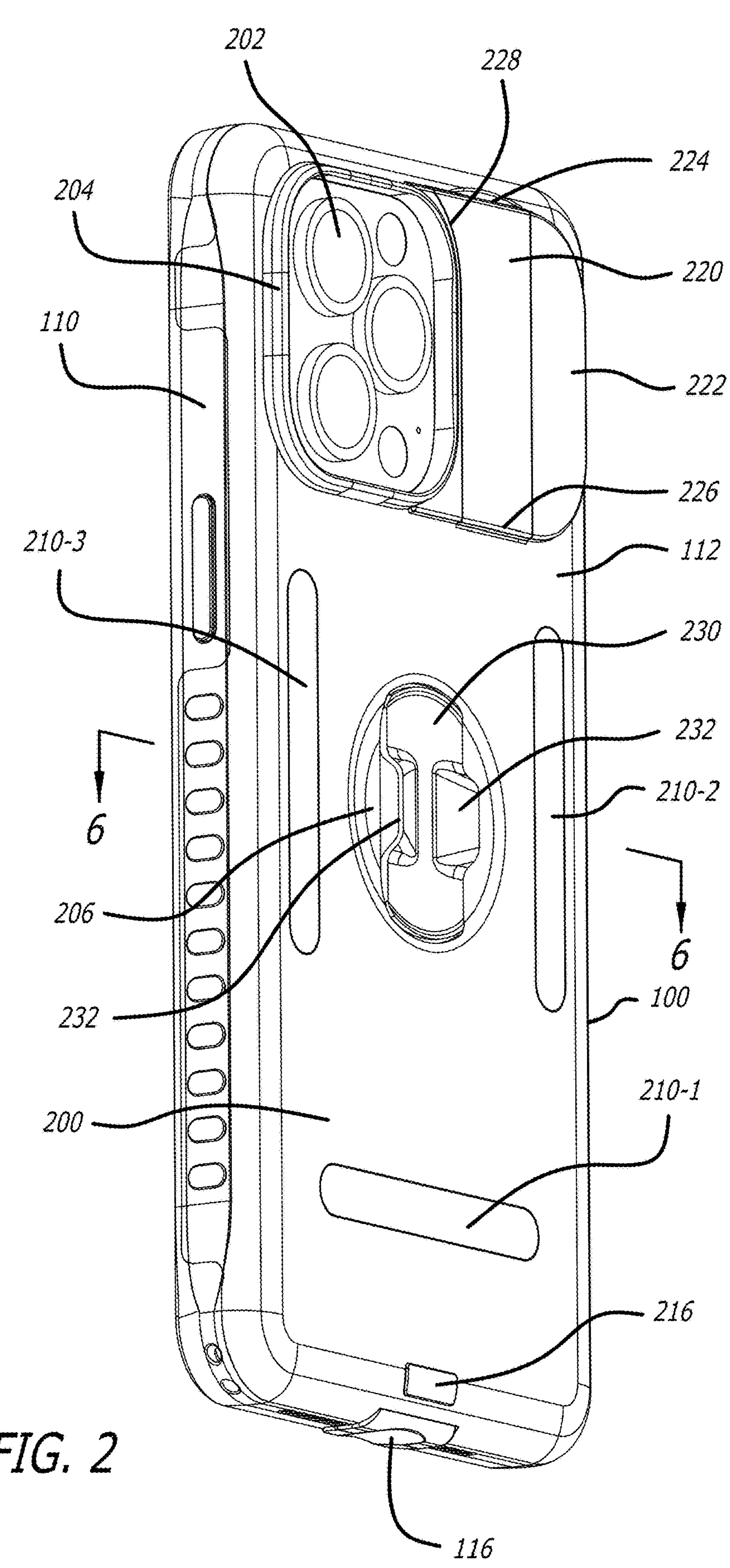
FIG. 2 is a rear perspective view of a case according to one embodiment of the invention holding a mobile device.

FIG. 2 is a rear perspective view of a case according to one embodiment of the invention holding a mobile device. As is typical of today's smart phones, lens assembly 202 extends some distance above the substantially planar back surface of the mobile device of which it is a part. The housing 100 has a lens ring 204 coupled thereto to protect the lens assembly 202. In one embodiment, lens ring rises approximately 1 mm from the back surface 200 of housing 100. Lens ring 204 protects the lens assembly 202. In some embodiments, lens ring 204 is user changeable to allow the case to conform to a desired user aesthetic.

Back surface 200 defines a generally centrally located concave recess 206 that provides a space into which a holding element can collapse when the device is against a generally flat surface. In one embodiment, a finger loop 230 is provided to facilitate one handed use of the device within the housing 100. In one embodiment, finger loop 230 has fins 232 that in conjunction with concave recess 206 allow a user to easily insert a finger of a desired hand into the finger loop 230 without use of the other hand. Finger 230 loop will then extend out of the housing 100 to facilitate carrying and use of the mobile device as described in greater detail below. In one embodiment, finger loop 230 is formed of an elastomeric material. In one embodiment, the elastomeric material is selected to have an elastic modulus such that the finger loop 230 and particularly the fins 232 collapse within the concave recess 206 responsive to the force exerted by magnets within the housing 100 when the housing 100 is coupled to, for example, a wireless charger or other flat surface. In some embodiments, the fins 232 collapse based solely on the weight of the device within the case when resting on a flat surface. It is desirable that the modulus be selected so that the lesser of the expected magnetic attractive force between the case and a surface or the weight of the case and device cause the fins 232 to collapse into the concave recess. By collapsing within the concave recess 206 the presence of the finger loop 230 does not increase the distance between a wireless charger coupled to the case and the wireless receiver within the device. As a result, the finger loop 230 does not degrade the wireless charging efficiency. In other embodiments, a T-grip or similar post based holding element can be substituted for the finger loop 230.

As alluded to above, users often find it desirable to attach their mobile device to, for example, gym equipment or other vertical or near vertical surfaces to allow viewing or easy access to the device while exercising or performing other activities that require a user's hands to be free. Magnets have been found to be a convenient way to temporarily attached devices to such surfaces. Unfortunately, the nonplanarity of newer smart phones caused by the lens assembly has resulted in an inability to achieve a stable magnetic coupling owing to the angle and distance from the magnets caused by the nonplanarity. In some embodiment, housing 100 captures one or more floating chassis 210-1, 210-2, 210-3 (generically floating chassis 210). Each floating chassis 210 contains one or more magnets and can rise a distance above back surface 200. It has been found that movement in the range of 0.85 mm to 1.05 mm is sufficient to accommodate existing lens structures and achieve a stable magnetic connection to planar vertical or near vertical surfaces. That is the magnetic force is sufficient to hold the weight of the case and device on such surfaces in the absence of other external forces.

In some embodiments, the chassis 210 are biased to reside substantially flush with the back surface 200 when not in the presence of an external magnetic mass. In some embodiments, the distance the chassis 210 can rise above back surface 200 is less than the height of lens ring 204. In such embodiments, one or more of the chassis 210 may not be in contact or may be in only partial contact with a surface to which the case is connected, but the magnetic force between the magnets within the chassis and the surface is increased by virtue of the reduced distance resulting from the range of motion above the back surface 200. In some embodiments, the chassis do not necessarily rise such that the exposed surface of the chassis 210 remains parallel to the back surface 200 of the housing 100. In some embodiments, e.g. chassis 210-1 may tilt to maximize its contact with the surface to which it attaches.

As used herein, "magnet" refers to a permanent magnet, that is an object made from a material that is magnetized and creates its own persistent magnetic field. As used herein, "magnetic mass" refers to a mass of any material to which a magnet is attracted. In some embodiments, each chassis contains one or more magnets that collectively expose regions of magnetic field at the back surface that alternate polarity. That is, a chassis 210 might expose, for example, three magnetic fields exhibiting a SNS or a NSN polarity pattern. While it is conceptually easiest to think of this as three distinct magnets, advanced manufacturing techniques permit a single structure to be imbued with multiple magnetic fields. Various embodiments may use more or fewer magnetic fields in each chassis 210.

A kickstand 220 is coupled to the housing 100. Kickstand 220 nests in a kickstand recess in the housing 100. In one embodiment, the kickstand recess is formed in a thickened region 222 adjacent to back surface 200 and lens ring 204. In one embodiment, thickened region 222 is molded to be thinner than the lens ring 204. That is, lens ring 204 rises above back surface 200 a greater distance than thickened region 222. In one embodiment, the kickstand, in a stowed configuration, is flush with the surface of the thickened region 222. In one embodiment, the thickened region 222 is in the lens adjacent portion of the case. As used herein the "lens adjacent portion" is the portion of the case above a line that would be formed by an extension of the bottom edge of the lens ring 204. In one embodiment, thickened region is also below the level of the lens assembly relative to the back surface 200 of housing 100 when a device in in the case. In one embodiment, kickstand 220 is formed to be substantially flush with the surface of thickened region 222 when in a stowed configuration. This has the effect that the package size of the case is not thickened by the introduction of the kickstand 220. As such a bounding box that would enclose the case without the kickstand 220 encloses the case with the kickstand 220. More specifically, a bounding box minimally enclosing the lens assembly and thickened region 222 (the volume of the box whose lower edge is the bottom edge of the lens ring) is no larger than a bounding box that would enclose the lens assembly and that portion of the case in the absence of the thickened region 222 or the kickstand 220. By efficiently using the space adjacent to the lens ring 204 for the kickstand 220 improves functionality of the case without negatively impacting its overall cross dimension.

In one embodiment, the distal end 224 of kickstand 220 is longer than proximal end 226 where the kickstand 220 couples to the case. This allows lens ring adjacent edge 228 to substantially follow the perimeter of lens ring 204 around its adjacent corner which provides a cleaner overall look to the case while also providing a longer contact surface when the kickstand 220 is deployed and the device is in portrait mode.

Kickstand 220 permits the device to be retained at an angle in at least one of portrait and landscape orientation on a horizontal or substantially horizontal surface. In some embodiments, kickstand 220 is formed of a thermoplastic. In some embodiments kickstand is formed of polycarbonate. In some embodiments, kickstand 220 is magnetically biased to remain in the kickstand recess unless acted on by an external force.

In some embodiments, digit cushion 116 has a foot 216 exposed through the back surface 200 of the housing 100. In one embodiment, foot 216 extends marginally above the back surface 200. In one embodiment, the foot 216 extends in the range of 0.3 mm to 0.5 mm above the back surface 200. Foot 216 both couples the digit cushion 116 to the housing 100 and provides a relatively high friction surface when the kickstand 220 is deployed and the device is in portrait orientation. This high friction surface enables the kickstand 220 to permit different ranges of tilt without the device sliding. The grips (114 from FIG. 1) provide an analogous function when the kickstand 220 is deployed and the device is in landscape orientation.

Figure 3:
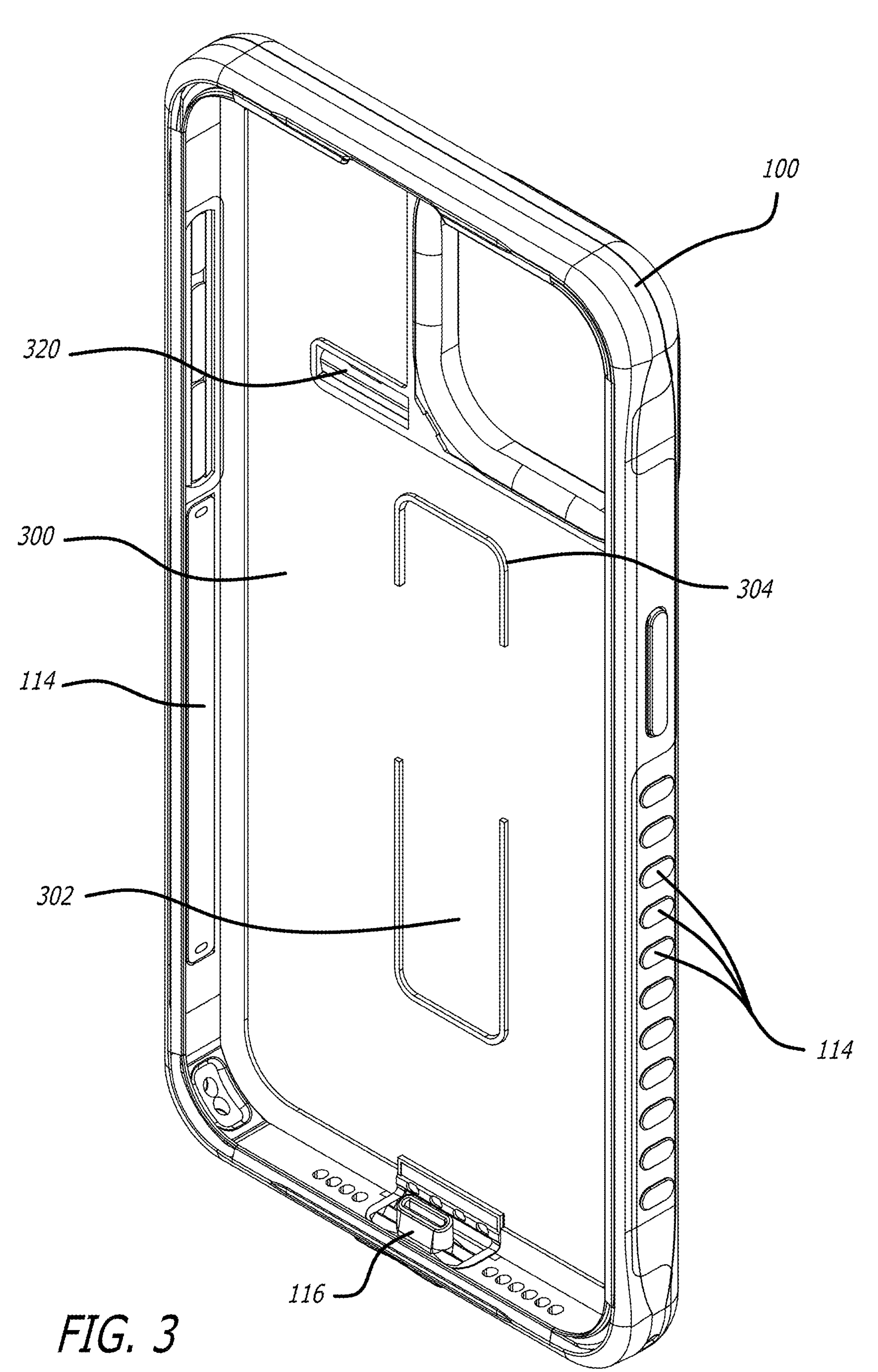
FIG. 3 is a perspective view of the inside of the case according to one embodiment of the invention.

FIG. 3 is a perspective view of the inside of the case according to one embodiment of the invention. A liner 300 resides on the floor of the housing 100. Liner may be a foam or fabric material substrate with an adhesive backing covering a portion of the underside of the substrate. In some embodiments, the substrate may be die cut. A hotmelt adhesive may be selectively applied so that the area of the liner 300 forming tabs 302, 304, the area of the liner 300 between the tabs 302, 304, and the portion of the liner overlying the chassis is adhesive free. Upper tab 304 and lower tab 302 are cut in the liner to allow access and user servicing of the finger loop (not shown in this figure). In particular, these tabs 302, 304 can fold up to allow a finger loop to be threaded into a track that underlies the liner beneath the tabs 302, 304. This permits user serviceability of the finger loop so that it can be switched out if damaged or if, for example, a different color scheme is desired. In some embodiments, the portion of the liner overlying the finger loop may have a friction reducing coating such as polyethylene terephthalate (PET).

It is desirable that the track be within the normal thickness of the back wall of the case. This is important both because a thinner ultimate package is more consumer desirable and because charging efficiency is affected by the distance between a wireless charge transmitter and the wireless receiver inside a device within the case. Existing injection molding techniques have been found inadequate to yield a track for the finger loop that is consistent, low friction and permits a sufficiently thin wall to allow the loop to reside within the housing wall without requiring a thicker wall. To avoid this thickening, one embodiment of the invention injection molds the housing 100 including the gross dimensions of the track and then the track is CNC milled to deepen the track and ensure a smooth low friction finish.

Kickstand hub 320 about which the kickstand is pivotally connected to the housing 100 is also shown. In some embodiments, the liner is cut so as not to overlie the hub 320 to avoid abrasion of the liner by the repeated movement of the hub. In some embodiments, grips 114 may be formed as strips of elastomeric material with a plurality of nodules that extend through the housing 100 to provide the external grips 114. In one embodiment, the voids in the housing through which the nodules extend are drafted to engage the nodules to hold the grips 114 in place when no device is in the housing 100. The digit cushion 116 is also visible. In some embodiments, the digit cushion 116 internal shape can be molded to engage the power port of the device. By engaging the power port, the digit cushion 116 prevent lint or other debris from entering the power port when the port is not otherwise in use.

Figure 4:
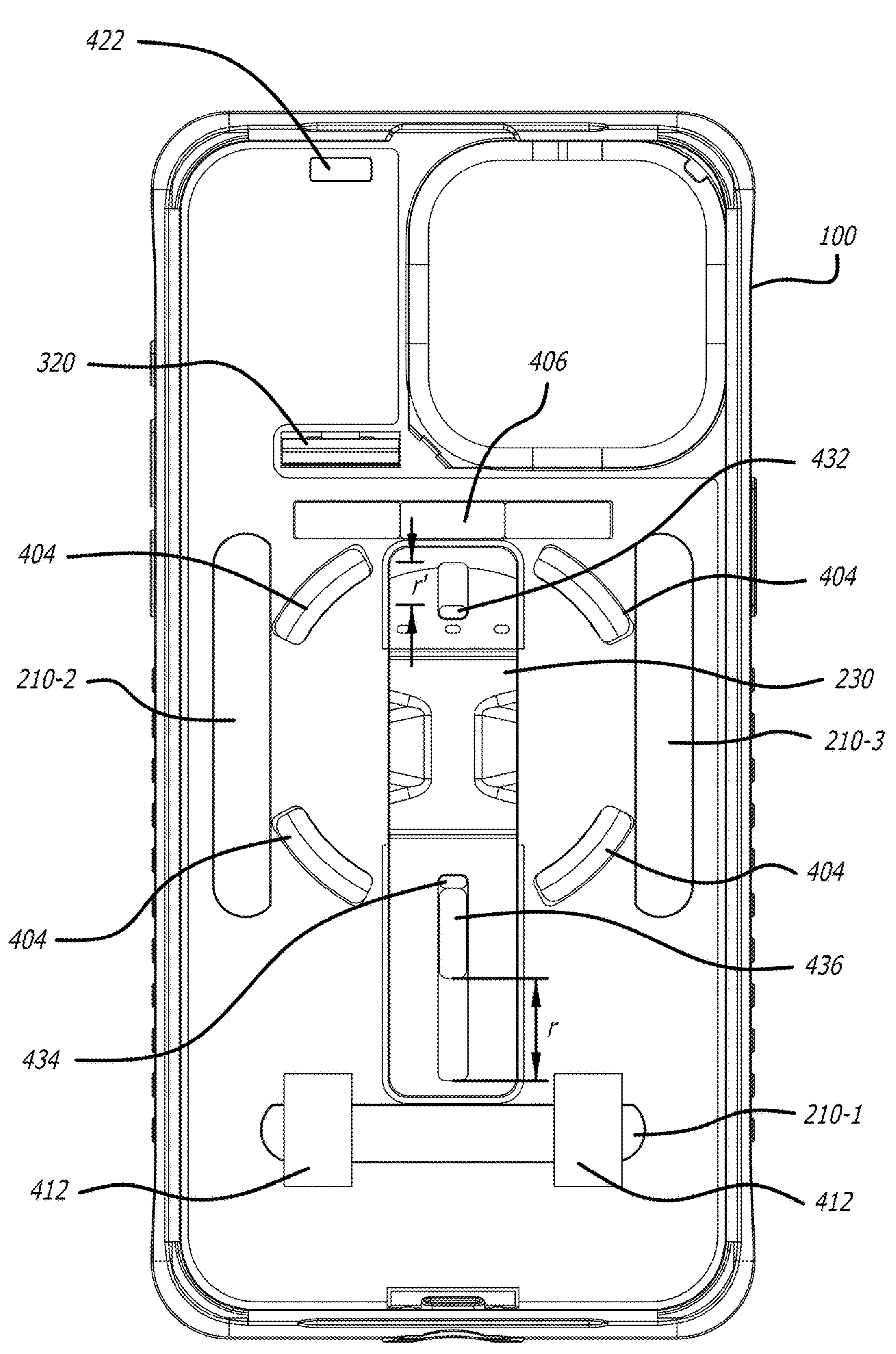
FIG. 4 is a view of the case according to one embodiment of the invention with the liner removed.

FIG. 4 is a view of the case according to one embodiment of the invention with the liner removed. In one embodiment, in addition to the floating chassis 210, embedded in the housing 100 a set of MagSafe® magnets 404. These magnets are configured to comply with the MagSafe® specification promulgated by Apple Inc. of Cupertino, California. In some embodiments, the MagSafe® magnets may be mounted in floating chassis instead of or in addition to chassis 210.

In some embodiments, mounting magnets 406 may be embedded in housing 100. Mounting magnets 406 permit the case to be coupled to legacy mounting structures such as those available from 1Lss, Inc of Los Angeles California. In some embodiments, the mounting magnets 406 are formed of a plurality of regions of magnetic material which immediately adjacent regions exposing opposite polarity magnetic fields at the external surface of the housing. While a single arrangement of mounting magnets 406 is shown, some embodiments may have two or more arrangements of mounting magnets dispose within the housing 100.

In some embodiments, kickstand biasing magnet 422 may be disposed within the housing 100. Kickstand biasing magnet 422 may attract a magnetic mass coupled to a distal end of the kickstand to bias the kickstand into the kickstand recess in the housing 100 until an external force is applied to the kickstand to move it into a deployed configuration. In some embodiment, the placement of the biasing magnet and the attracted mass is reversed. That is, some embodiments may have the biasing magnet attached to the distal end of the kickstand and magnetic mass to which it is attracted coupled in the housing 100.

The floating chassis 210 are captured within the housing 100 and lightly biased to remain in a retracted configuration until a magnetic mass comes proximate to the external back surface of the housing 100. To achieve this bias, some embodiments provide biasing masses 412 between the chassis 210 and the liner. While biasing masses 412 are only shown in use with chassis 210-1, similar masses can be used with any chassis 210. In some embodiments, biasing masses 412 may be pieces of magnetic steel, magnetic tape, magnetic polymer or the like. It has been found that the magnetic content of the device itself provides the necessary bias for chassis 210-2, 210-3 in some embodiments of the invention.

In some embodiments, molded in the housing 100 is a finger loop track. Preferably the track is molded into the rigid material, e.g., polycarbonate, the low friction of which allows the finger loop 230 to slide easily from a stowed position to a deployed position. For ease of returning the loop from the deployed configuration to the stowed configuration, it is desirable that the finger loop 230 be substantially symmetrical in its deployed configuration. To achieve the desired symmetry, it is useful that both ends of the finger loop 230 have some degree of movement. Furthermore, making material in the central region (the portion visible when the finger loop 230 is stowed) thinner than the material that forms the upper and lower portions (those portions within the housing 100 when the finger loop 230 is stowed) of the finger loop 230 has been found to facilitate the transition from the deployed to the stowed configuration.

To allow motion from both ends, in some embodiments, an upper stop 432 and lower stop 434 may be molded as part of housing 100 or coupled thereto. Upper stop and lower stop constrain the range in which the finger loop can extend. In some embodiments, an upper end of finger loop 230 can move in a range r' relative to upper stop 432 and the lower end of the finger loop 230 can move in a range r relative to lower stop 434. By allowing both ends of the finger loop to move in some range the symmetry of the deployed finger loop 230 is improved. Increased symmetry in the deployed configuration increases the ease with which the finger loop 230 can be restowed. That is, when a loop is asymmetric in a deployed configuration it is more likely to fold on itself when pushed with one finger to return it to the stowed configuration. In some embodiments, the liner has a low friction film coating the portion of the liner overlying the finger loop to further reduce friction as the loop moves between stowed and deployed configurations.

Because one size does not fit all, some embodiments, provide a spacer 436 that can be removably adhered in the finger loop track to adjust the range r and thereby adjust the size of the finger loop 230 in the deployed configuration. In some embodiments, a plurality of spacers of different sizes are provided to be optionally selected by the user. It should be understood that the largest finger loop 230 is achieved with the spacer 436 removed. Longer spacers will reduce the range r and thereby reduce the size of the deployed finger loop 230. In some embodiments, one or more spacers may be provided to change the range r'.

Figure 5A:
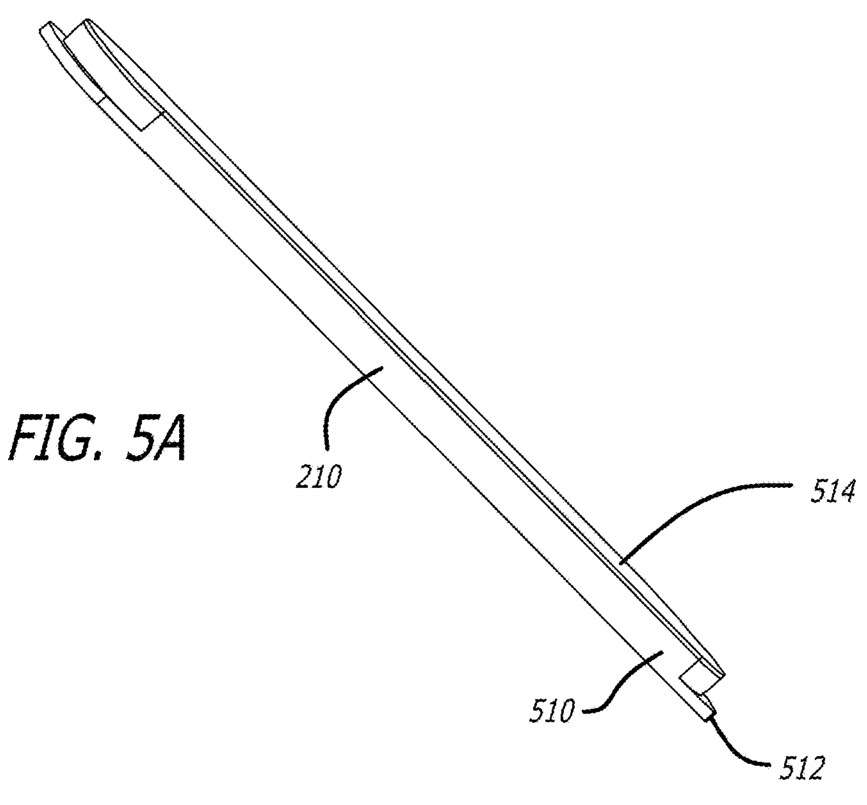
FIG. 5A is a perspective view of a chassis according to one embodiment of the invention.

FIG. 5A is a perspective view of a chassis according to one embodiment of the invention. The chassis 210 has a base 510 and a cap 514. The base may be formed out of a thermoplastic. In some embodiments, the base 510 may be injection molded. In other embodiments, the base 510 may be CNC milled. In one embodiment, the base 510 is formed from polycarbonate. The base 510 defines an internal chamber to hold one or more magnets. In some embodiments, rim 512 is formed as part of the base 510. Rim 512 follows a substantial portion of the lower perimeter of the base 510. When installed in the housing, the rim 512 underlies a rim of the housing such that the chassis is captured (can't escape the housing). In one embodiment, cap 514 is a thin sheet of thermoplastic such as polycarbonate. In other embodiments cap 514 may be metallic. Cap 514 may be adhered, welded or otherwise substantially permanently coupled to the base 510. In use the rim 512 is proximate to the device in the housing and the cap 514 is distal to the device.

Figure 5B:
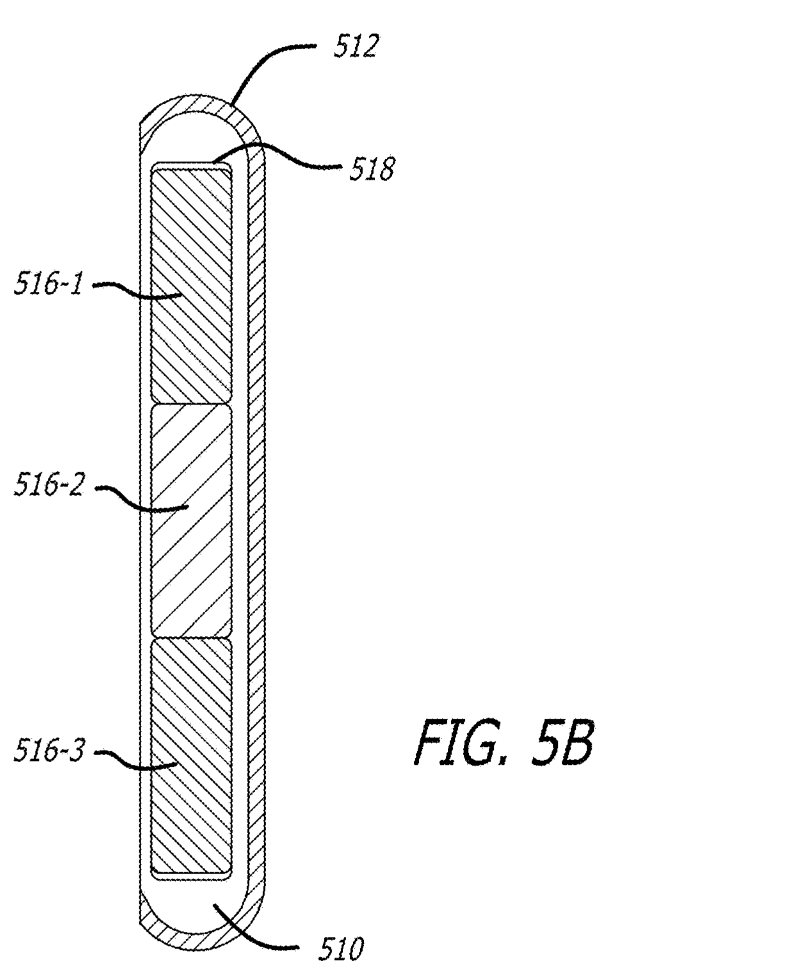
FIG. 5B is a view of the chassis with the cap removed.

FIG. 5B is a view of the chassis with the cap removed. A chamber 518 defined by the base 510 is shown containing three magnets 516-1, 516-2, 516-3 (generically magnets 516). In various embodiments, the chamber 518 can contain more or fewer magnets 516. For example, chamber 518 could contain two magnets 516, five magnets 516 or some other number of magnets 516. It is preferred that adjacent regions of the magnets expose opposite polarity magnetic fields. In some cases, for example, magnets 516-1 and 516-3 may expose a north polarity while magnet 516-2 exposes a south polarity. In some cases, a single magnetic structure may have a region that exposes a north polarity and an adjacent region that exposes a south polarity.

In some embodiments, the floor of chamber 518 has a thickness greater than the thickness of the cap 514. For example, in one embodiment, the floor may be approximately 0.45 mm thick and the cap 514 may be 0.2 mm thick. As a result of these thicknesses, magnets 516 will be twice as far from the internally biasing magnetic masses as the magnets will be from a desired attachment surface when case is brought near a desired mounting surface. Thus, a combination of the larger magnetic mass and the reduced relative distance causes the chassis to overcome the weak retraction bias and float to an extended configuration. In some embodiments, the floor 518 and the rim 512 have the same nominal thickness.

Figure 6:
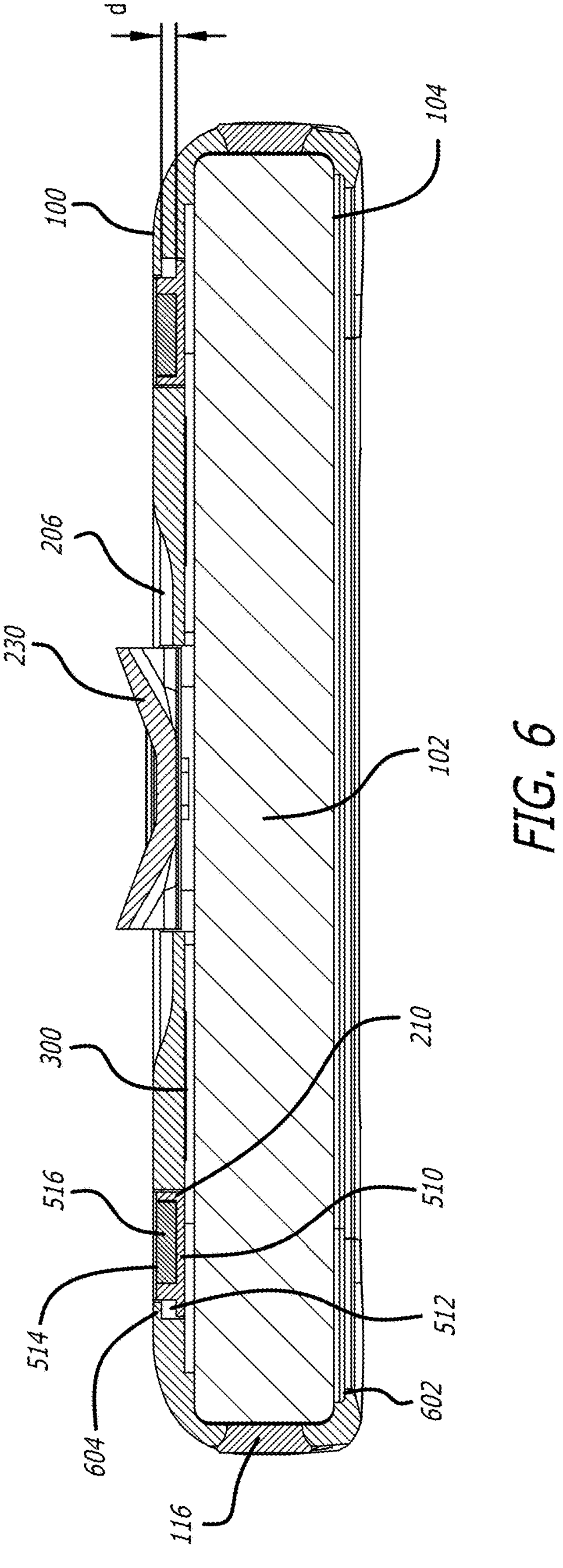
FIG. 6 is a cross section of the embodiment of FIG. 2 through line A-A.

FIG. 6 is a cross section of the embodiment of FIG. 2 through line A-A. In this view, the chassis 210 is captured within housing 100 between the liner 300 and the housing rim 604. Chassis rim 512 engages housing rim 604 when the magnets 516 of chassis 210 are attracted to an external magnetic mass. This arrangement allows the chassis 210 to float a distance d above a back surface of the housing 100. In some embodiments the distance d is nominally 1 mm. Because the magnetic force increases nonlinearly as the distance between the magnets 516 and the a mounting surface decreases incremental increases in the float range can achieve large increases in the mounting force provided by the chassis 210. In some embodiments, d will be in a range of 0.85 mm to 1.05 mm. To some degree distance d is driven by the thickness of the housing 100 as greater travel can be achieved with a thicker housing, but many users prefer the protective case device package be as thin as possible while still providing adequate protection for the device.

In this view, the screen protector 104 is shown atop the device 102. In some embodiments, housing 100 has a lip 602 that overlies the screen protector 104 for substantially the entire perimeter of the screen protector. This lip 602 improved the appearance of the device 102 with screen protector 104 as well as protecting the screen protector from peeling up at the edges.

Additionally, the concave recess 206 can be seen in profile. As discussed above, finger loop 230, in some embodiment is made of a material of an elastic modulus that causes it to collapse into the concave recess 206 under the force of, for example, a MagSafe® charger coupling to the housing 100.

Figure 7:
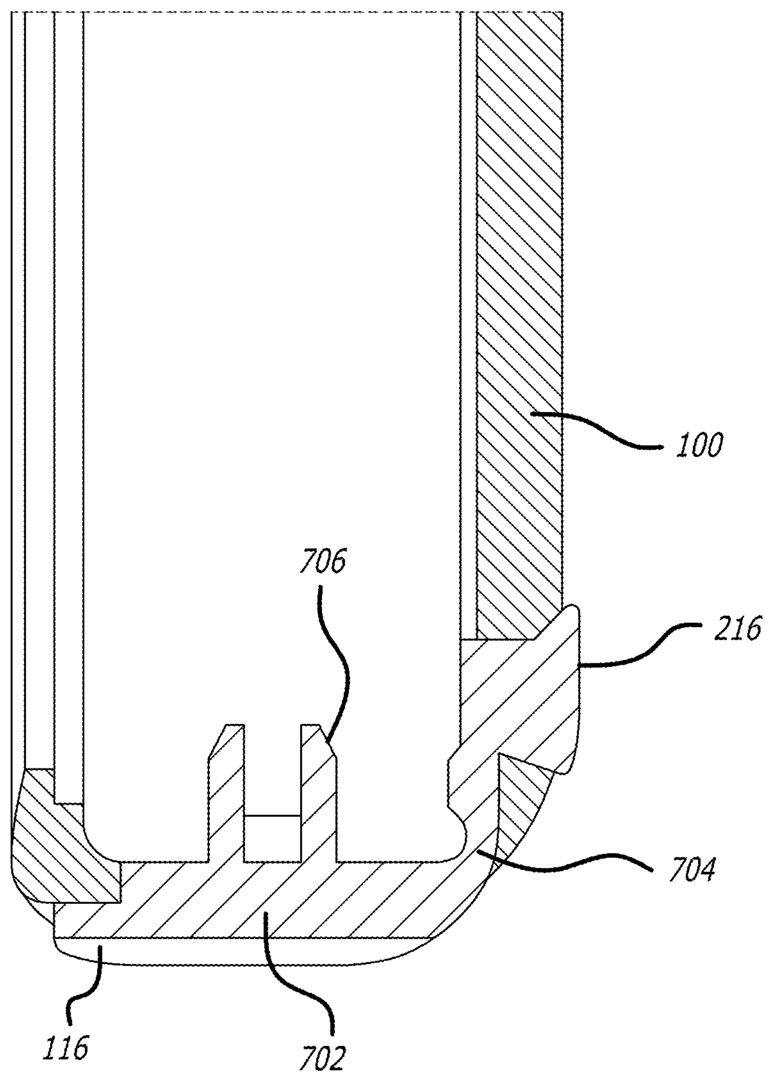
FIG. 7 is a cross section view of the digit cushion installed in a housing according to one embodiment of the invention.

FIG. 7 is a cross section view of the digit cushion installed in a housing according to one embodiment of the invention. Digit cushion 216 has four primary parts: a cushion portion 702, a foot 216, a living hinge 704 and a socket insert 706. Foot 216 couples the digit cushion 216 to the housing 100 and provides a high friction surface when the kickstand is employed in portrait orientation. The cushion portion 702 increases user comfort when the device is held in one hand by providing a soft resilient landing spot for, generally, the little finger of the hand holding the device. The socket insert 706 is dimensioned to be inserted into the power port of the mobile device. It holds the cushion portion 702 in place and prevents debris from entering the port when the port is not otherwise in use. Living hinge 704 flexibly couples the cushion portion 702 to the foot 216 so it can easily be folded out of the way when access to the power port is desired but remains connected to the housing to avoid risk of loss.

Figures 8A, 8B, 8C:
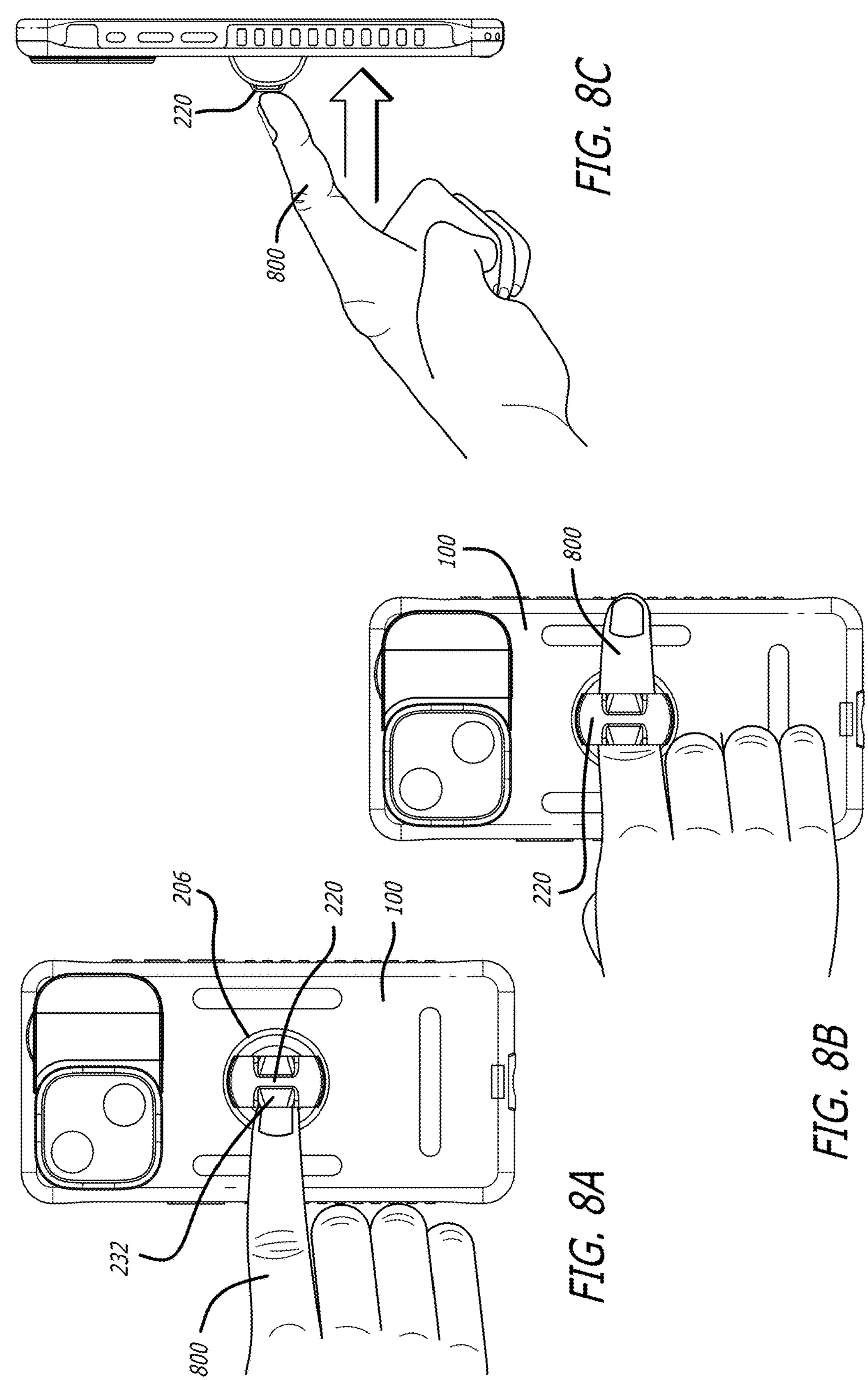
FIGS. 8A-C show mechanical operation of the finger loop in one embodiment of the invention.

FIGS. 8A-C show mechanical operation of the finger loop in one embodiment of the invention. A finger 800 can easily be inserted into the concave recess 206 under fin 232 of finger loop 220. As the user pushes their finger 800 though the finger loop 220, the loop is drawn out of the housing 100 and engages the finger 800 as shown in FIG. 8B. in this deployed configuration the device is easily held without any grip strength. When the finger loop 220 is no longer desired, pressure on the external surface of the finger loop 220, as shown in FIG. 8C, returns it easily to a stowed configuration.

Figure 9:
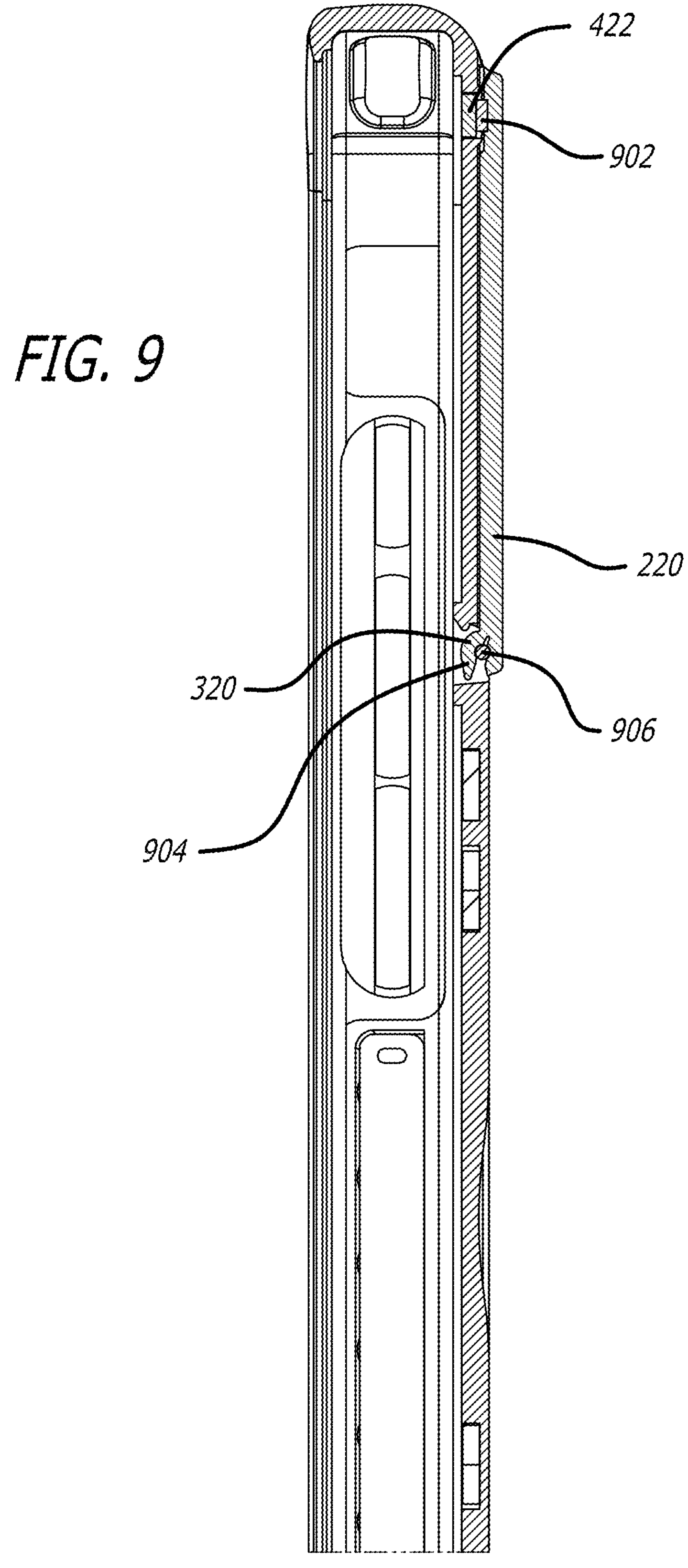
FIG. 9 is a cross sectional view of the kick stand according to one embodiment of the invention.

FIG. 9 is a cross sectional view of the kick stand according to one embodiment of the invention. One problem with some historical kickstands used with mobile device cases is that the metallic content of the kickstand interfered with the device antenna causing communication degradation. Kickstand 220 is formed from polycarbonate or other suitable thermoplastic. A small metal pin 906 serves as the axis of rotation from kickstand hub 320. This small amount of metal reduces the risk of interference. In one embodiment, pin 906 is insert molded into housing 100. Hub 320 is molded to snap fit onto the pin 906. In one embodiment, hub 320 is molded to have one or more flat surfaces 904 that effectively act as detents to allow the kickstand 220 to remain in a deployed position until force is applied to the kickstand 220 to overcome the detent. In some embodiments, a plurality of flat surfaces on the hub 320 allow the kickstand 220 to remain in different positions in its range of motion such that different tilt angles for the device can be achieved. In one embodiment, coupled to the kickstand 220 distal to the hub 320 is a magnetic mass 902 that is acted upon by kickstand bias magnet 422 to retain the kickstand in a stowed configuration until an external force is exerted on the kickstand 220 sufficient to overcome the attraction of the bias magnet 422.

Figure 10A:
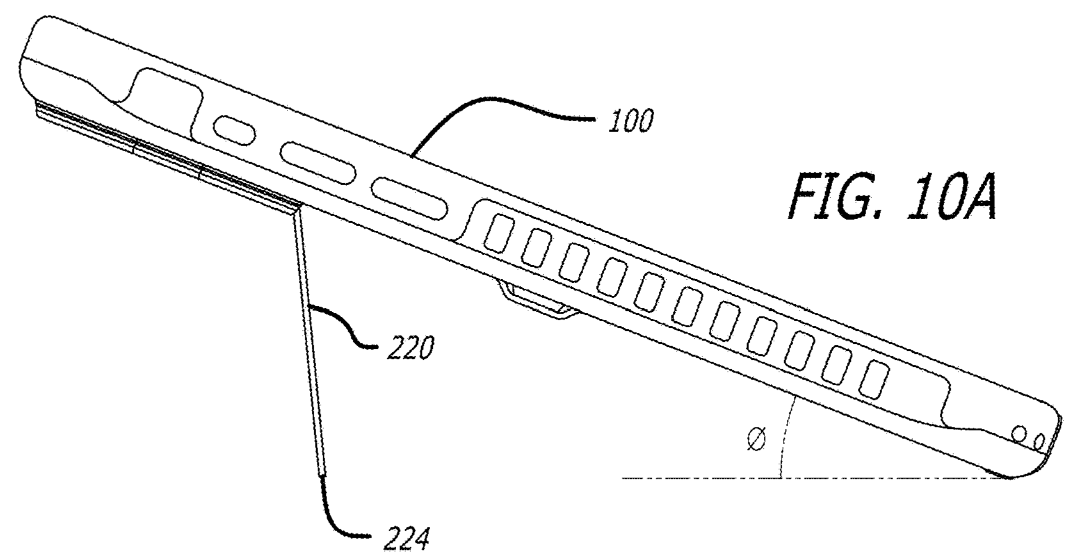
FIG. 10A-C show a case of an embodiment of the invention with the kickstand deployed.
Figure 10B:
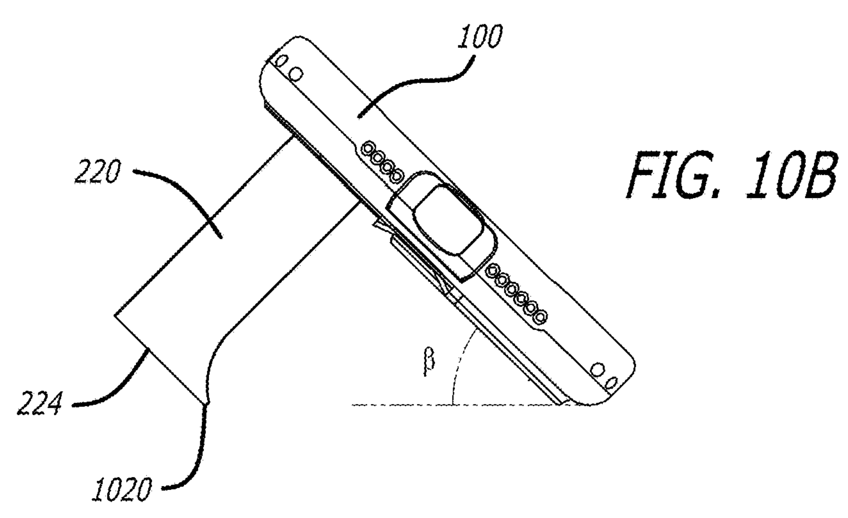
Figure 10C:
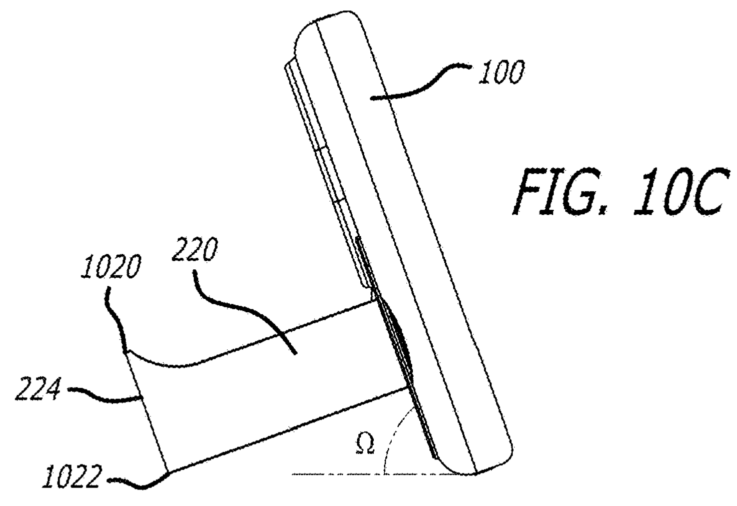

FIG. 10A-C show a case of an embodiment of the invention with the kickstand deployed. It has been found that most users place the device in landscape orientation when, for example, watching a movie. Most uses in landscape mode involve very little physical interaction between the user and the device. Conversely, most users have their device in portrait orientation when working on the device, for example, typing an email or other document on the onscreen keyboard. FIG. 10A shows kickstand 220 deployed and the housing 100 residing in a portrait orientation. In portrait orientation with kickstand deployed, the housing forms an angle ø with the surface on which the device rests. In one embodiment, the angle ø is in the range of 15°-30°. This range of angles allows for comfortable use of the onscreen keyboard where steeper angles would impair keyboard use. The kickstand 220 is configured so that the entire distal end 224 of the kickstand 220 rests on the surface. This allows the device to remain relatively stable while the touchscreen is repeatedly manipulated.

FIGS. 10B and 10C show the device with the kickstand 220 deployed and the housing 100 in a landscape orientation. It can be seen that in the shown embodiment, kickstand 220 looks generally like a boot from the side. In FIG. 10B, the housing forms an angle ß with the surface on which it rests. In one embodiment, angle ß may be in the range of 35°-50°. In this orientation, only the toe 1020 of the boot shape is in contact with the surface. If a steeper viewing angle is desired, the device can be flipped as shown in FIG. 10C. In this configuration, the heel 1022 of the boot is in contact with resting surface and the housing 100 forms an angle Ω with the surface. In some embodiments angle Ω is in the range of 60°-75°.

Figure 11:
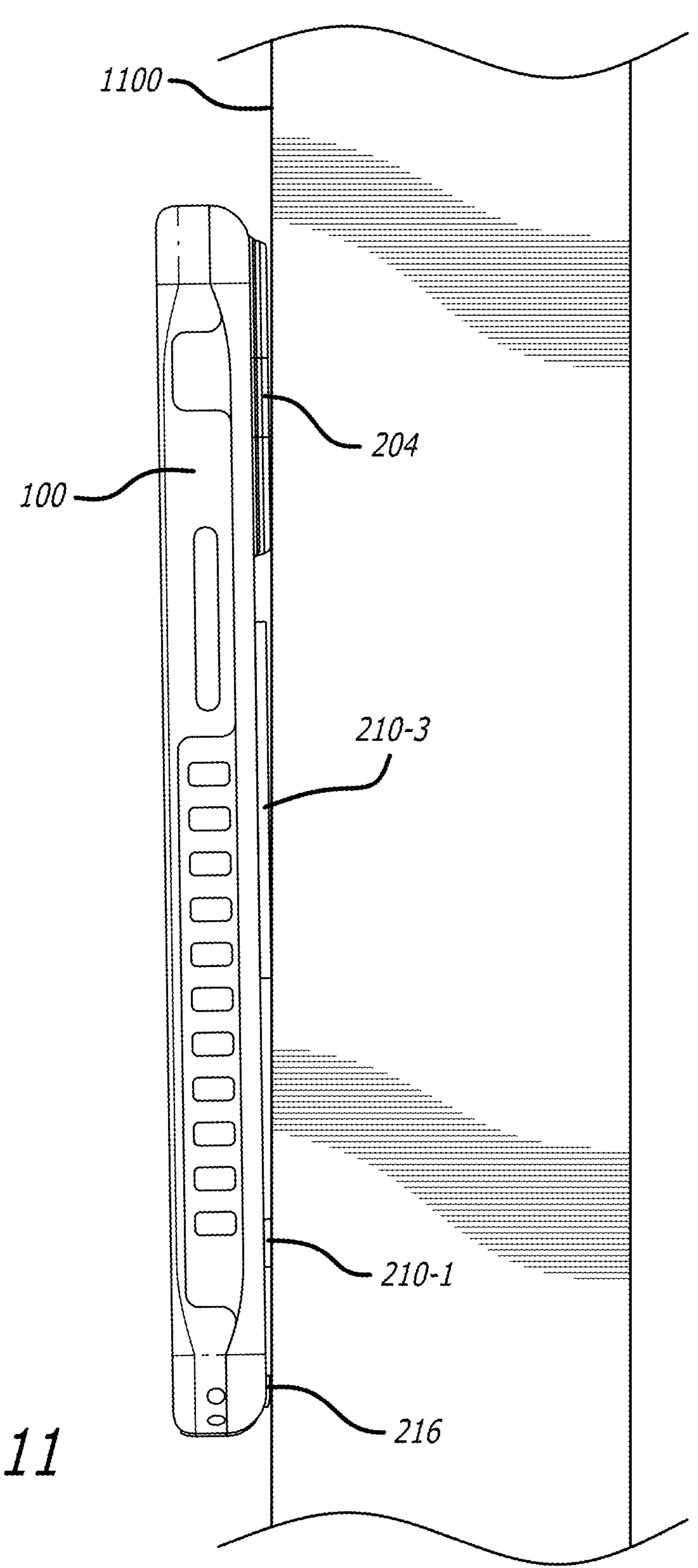
FIG. 11 shows the case coupled to a substantially vertical surface.

FIG. 11 shows the case coupled to a substantially vertical surface. When the housing 100 is brought near a ferromagnetic mounting surface 1100, the chassis 210 rises from the back surface of the housing and magnetically couple to the mounting surface 1100. The lens ring 204 (and the lens assembly it protects) prevents the case from lying flat on the surface. By rising and tilting to some degree chassis 210 permits greater magnetic coupling strength. As shown in this view, in some embodiments, chassis 210-1 will rise and tilt to achieve maximal surface contact with the mounting surface 1100. In some embodiments, chassis 210-3 (and 210-2 not shown in this view) will only contact the mounting surface 1100 near a bottom end the chassis 210-3. Nevertheless, chassis 210-3 and 210-2 provides sufficient magnetic attraction to maintain the housing and device on the mounting surface 1100. In some embodiment, foot 216 may also contact the mounting surface 1100 and provide frictional engagement thereof that reduces the shearing forces acting against the magnetic coupling.

Embodiments of the invention have numerous features each of which provide value over existing phone cases independent of the other features. For example, the floating magnetic features are uniquely valuable without e.g. the kickstand, the digit cushion, the finger loop or other features of the disclosed case. Similarly, the finger loop has unique value independent of the floating magnetic features or any of the other features. The kickstand with its detented hub also represents a significant improvement over existing art and the benefits do not rely on the other features disclosed as part of various embodiments of the instant invention.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. A protective case for a mobile device comprising:
a housing defining a recess to receive the mobile device;
a kickstand coupled to the housing in a lens adjacent portion of the housing, wherein a bounding box required to contain a lens assembly and the lens adjacent portion of the housing with the kickstand in stowed configuration is no larger than a bounding box required to contain the lens assembly and lens adjacent portion with no kickstand present and wherein in a deployed configuration the kickstand can maintain the case in either a portrait orientation or a landscape orientation.

2. The protective case of claim 1 wherein the kickstand maintains the device at an angle in a range of 35°-50° when deployed in a landscape orientation.

3. The protective case of claim 1 wherein the kickstand maintains the device at an angle in a range of 60°-75° when deployed in a landscape orientation.

4. The protective case of claim 1 wherein the kickstand permits a first landscape orientation that maintains the device at an angle in a range of 35°-50° when deployed and a second landscape orientation that maintains the device at an angle in a range of 60°-75° when deployed.

5. The protective case of claim 1 wherein the kickstand maintains the device at an angle in a range of 15°-25° when deployed in a portrait orientation.

6. The protective case of claim 1 wherein the kickstand wherein a distal end of the kickstand has a width greater than a width at a proximal end of the kickstand where the kickstand couples to the housing.

7. The protective case of claim 6 wherein substantially the entire width of the distal end is in contact with a supporting surface when the kickstand is deployed and in the portrait configuration.

8. The protective case of claim 1 wherein the kickstand is shape to have a lens adjacent edges substantially matching a profile of a lens housing and an opposite edge that is substantially linear.

9. The protective case of claim 1 wherein the kickstand is coupled to the housing by a metallic axle pin and wherein an end of the kickstand coupled to the axle pin is detented to maintain the kickstand in at least one deployed orientation.

10. The protective case of claim 1 further comprising:
a first magnetic mass coupled to the kickstand; and
a second magnetic mass coupled to the housing to engage the first magnetic mass to cause the kickstand to be biased into a stowed orientation.

11. A protective case for a mobile device comprising:
a housing defining a recess to receive the mobile device, the housing further defining a concave recess on a backside of the housing, the backside having a thickness; and
a resilient member coupled to reside within the thickness, a portion of the resilient member exposed above the concave recess when no force is applied;
wherein, in use, the resilient member engages at least one finger of a user to a grip required to hold the mobile device and when not in use is collapsible within the concave recess responsive to a force less than a lesser of a force caused by a weight of the device under the influence of gravity or magnetic force of attraction of a wireless charger; and
wherein the resilient member comprises an upper region a lower region and an intermediate region wherein the intermediate region overlies the concave recess and both the upper region and the lower region move relative to the housing to permit the resilient member to transition to a deployed configuration.

12. The protective case of claim 11 wherein the resilient member is a finger loop and wherein the housing defines a track for a finger loop.

13. The protective case of claim 12 wherein the housing comprises:
an upper stop that constrains motion of a top portion of the finger loop to a first range; and
a lower stop that constrains motion of a bottom portion of the finger loop to a second range.

14. The protective case of claim 13 further comprising:
a spacer for insertion into the track to change one of the first range and the second range.

15. A protective case for a mobile device comprising:
a housing defining a recess to receive the mobile device, the housing further defining a concave recess on a backside of the housing, the backside having a thickness; and
a resilient member coupled to reside within the thickness, a portion of the resilient member exposed above the concave recess when no force is applied;
wherein, in use, the resilient member engages at least one finger of a user to a grip required to hold the mobile device and when not in use is collapsible within the concave recess responsive to a force less than a lesser of a force caused by a weight of the device under the influence of gravity or magnetic force of attraction of a wireless charger; the portion including one or more fins that extend above the concave recess when no force is applied.

16. The protective case of claim 15 where in the fins permit single hand access to the resilient member to move it into a deployed configuration.

17. The protective case of claim 16 wherein in the deployed configuration the resilient member is substantially symmetric relative to the concave recess.

18. A protective case for a mobile device comprising:
a housing defining a recess to receive the mobile device, the housing further defining a concave recess on a backside of the housing, the backside having a thickness; and
a resilient member coupled to reside within the thickness, a portion of the resilient member exposed above the concave recess when no force is applied;

wherein, in use, the resilient member engages at least one finger of a user to a grip required to hold the mobile device and when not in use is collapsible within the concave recess responsive to a force less than a lesser of a force caused by a weight of the device under the influence of gravity or magnetic force of attraction of a wireless charger; and wherein the resilient member comprises: an upper region a lower region and an intermediate region wherein the intermediate region has a thickness less than a thickness of the upper region or the lower region.

* * * * *